United States Patent [19]

Huckabee et al.

[11] 4,435,740
[45] Mar. 6, 1984

[54] ELECTRIC CIRCUIT PACKAGING MEMBER

[75] Inventors: Bill F. Huckabee, Santa Cruz; William L. Wright, Saratoga, both of Calif.

[73] Assignee: International Business Machines Corporation, Armonk, N.Y.

[21] Appl. No.: 316,573

[22] Filed: Oct. 30, 1981

[51] Int. Cl.³ ............................................. H05K 1/18
[52] U.S. Cl. ................................ 361/398; 174/52 FP; 361/400; 361/408
[58] Field of Search ............... 361/398, 400, 401, 408, 361/409; 174/52 FP

[56] References Cited

U.S. PATENT DOCUMENTS

| | | | |
|---|---|---|---|
| 3,484,534 | 12/1969 | Kilby et al. | 361/401 X |
| 3,517,430 | 6/1970 | Johnson et al. | 361/398 X |
| 3,597,660 | 8/1971 | Jensen et al. | 361/398 |
| 3,662,230 | 5/1972 | Redwantz | 174/52 FP |
| 3,683,105 | 8/1972 | Shamash et al. | 174/52 FP |
| 3,684,818 | 8/1972 | Netherwood | 361/398 X |
| 3,828,215 | 8/1974 | Bilsback | 361/398 X |

OTHER PUBLICATIONS

D. G. McBride, Multifunction Plug for IC Package, IBM Technical Disclosure Bull., v. 21, #9, Feb. 1979, pp. 3594 & 3595.

Primary Examiner—R. R. Kucia
Attorney, Agent, or Firm—R. E. Cummins; G. E. Roush

[57] ABSTRACT

This electronic circuit device packaging member enables a higher density of substrate pads and connection block pins to be connected at lower cost and greater yield than for prior art devices. The packaging member comprises a multiple of conductors fixed in place by a flexible film carrier of annular configuration surrounding a ceramic substrate bearing electronic circuit components having input/output terminal connecting pads about the periphery of the substrate. Electric circuit connecting blocks having connecting pins are arranged at the periphery of the annular carrier. The multiple of conductors individually interconnect corresponding pads and pins. The film carrier has apertures at the locations of the pads and at the locations of the pins where the conductors or lands are configured for ready connection to the pads and pins, or by gang soldering.

The dimensions of the apertures and the conductors or lands afford considerable leeway in making the connections.

4 Claims, 5 Drawing Figures

ELECTRIC CIRCUIT PACKAGING MEMBER

FIELD

The invention relates to the art of electonic device packaging, and it particularly pertains to an interconnecting carrier member for connecting a substrate carrying an electronic circuit to connecting terminals of utilization circuitry.

BACKGROUND

Electric and electronic circuits have been formed in semiconductor processed and like devices for some time. Also for considerable time, it has been the practice to connect circuit terminals on a substrate carrying electronic circuitry to terminals connected to utilization circuitry by means of additional interconnecting members frequently referred to as packaging member assemblies.

Many packaging member assemblies and packaging members have been devised and improvements made. Cost reduction alone has spurred many such projects. Thermal relationships between components and/or the interconnecting packaging member have resulted in different structures. Power dissipation, other than that of thermal nature, wirability and "crossover" capability are other factors of interest. All of these factors have been considered and particular attention has been given to surer gang solderability and increased terminal density in the development of the packaging member according to the invention.

SUMMARY

The objects of the invention referred to indirectly hereinbefore and those that will appear as the specification progresses obtain with an electric circuit packaging member comprising a flat flexible film of annular configuration having apertures arranged near the inner and outer peripheries thereof overlapping the locations of substrate connecting pads and connecting block pins. Electronically conductive leads are arranged between corresponding apertures on the inner and outer peripheries. These leads preferably are formed by laminating conductive material, preferably copper, to the entire film and etching to form conductive lands bridging the apertures corresponding to the connecting pads and preformed for soldering at the inner ends and apertured at the outer ends for surrounding the connecting pins. Preferably, the outer ends result in through plated viaducts for better soldering to the connecting pins. Solder fillets between the preformed lands at the one end and the pads tend to draw the bridging lands down onto the pads. The apertures in the film tend to confine the solder to the pad or pin located thereat and to prevent bridging to adjacent pads or pins.

Preferably, another film of substantially the same configuration is arranged over the lands for protection. A preferred embodiment of this protective film has enlarged apertures for easier access for the soldering operation.

Prior Art

There is prior art having some structure in common with the structure according to the invention as is found in these U.S. Patents:
U.S. Pat. No. 3,711,626 1/1973 Kilby, et al. 174/68.5
U.S. Pat. No. 3,872,583 3/1975 Beall, et al. 29/624
U.S. Pat. No. 4,231,154 11/1980 Gazdik, et al. 29/840
In the defensive, publications:
T 955,008 2/1977 Gregor, et al. 357/80
And in other literature:
J. D. Larnerd, "IC Package Assembly;" IBM Technical Disclosure Bulletin; Vol. 20, Nr. 12, May 1978; p. 5141.

The patent to Kilby and VanTassel is directed to a printed circuit board on which semiconductor devices are mounted by means of metal conductors on the board and wires embedded within the board. The closely spaced conductors afforded by etching processes as in the structure according to the invention among other things and absent from the description of this patent.

The patent to Beall and Zasio shows an annular substrate-to-connection block member which at first glance is similar to that of the invention but on inspection is found to be only superficially so. The terminal structure of the lands, according to the invention among other things, is entirely lacking from this reference patent.

The Gazdik and McBride patent discloses an electronic packaging member having some superficial similarity to that according to the invention but the printed circuit conductors are inflexibly connected to connector pins and to I/O pads on the member itself in contradistinction to the terminal structure of the lands according to the invention.

The defensive publication of Gregor and Shepheard discloses an arrangement in which the thermal coefficients of expansion must be matched for two parts of an assembly which has rather exact requirements for connecting pads and pins. The arrangement according to the invention is free of these requirements.

The technical disclosure of Larnerd reveals a flexible laminate having printed circuit conductors thereon but requires material having a thermal expansion coefficient of low value to minimize stresses due to the use of conventional beam lead terminations, which requirement is obviated in the structure according to the invention.

DRAWING

In order that all the advantages of the invention obtain in practice, the best mode embodiment thereof, given by way of example only, is described in detail hereinafter, with reference to the accompanying drawings, forming a part of the specifications, and in which.

DESCRIPTION

Figure 1:
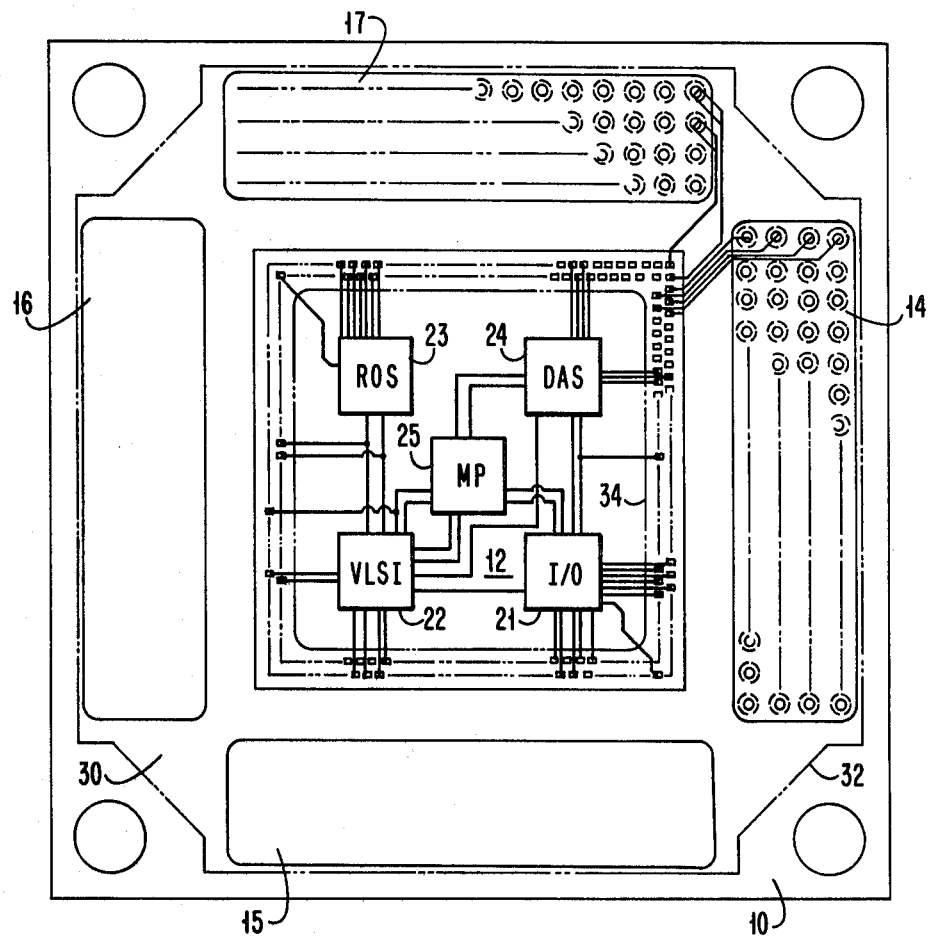
FIG. 1 depicts a layout of components for electric interconnection by a carrier member according to the invention.

A layout of electronic components requiring electronic interconnection is shown in FIG. 1 along with some detail of interconnection by a carrier member according to the invention. A metal mounting base, preferably copper, 10 is arranged for supporting a substrate 12 and four connector blocks 14, 15, 16 and 17. The mounting base 10 is conventional in construction, as is the substrate 12 except for a staggered double row of terminal contact solder pads. The latter are arranged for the maximum number of pads possible in accordance with the feature of the invention that maximizes the number of Input/Output (I/O) leads in a given application. The connector blocks 14–17, likewise conventional, are chosen for one maximum density in an area convenient in size and shape for the application as will become more apparent as the specification progresses. A few semiconductor circuit chips 21–25 are shown by way of example only with but a few electric leads to I/O solder pads. Usually all, or nearly all, of the I/O pads are put to use; the usual problem is to work to the limited number available.

It remains in this illustration to provide electric connections individually between each I/O pad and a corresponding connecting pin on one of the four connector blocks. An interconnecting member 30 according to the invention is shown only generally by a pair of chain lines 32 and 34 in FIG. 1. This carrier member 30 is shown more clearly in FIGS. 2 and 3.

The interconnecting member 30 comprises at least a flexible polyimide film 30' and a multiple of electric current carrying conductors or lands 33. Preferably, a protective covering of polyimide film 30" is provided. The two pieces of film are substantially identical except that the aperture 42 in the film 30" is larger than the aperture 41 in the film 30' at the connecting pin end of the conductor 33 as readily seen in FIG. 3, the apertures 31 are the same in both films 30' and 30", and the peripheral edges 32', 34' of the two films coincide at all points.

The contact apertures 31 and 41 (and 42) are made first. The conductors or lands 33 are then formed by laminating copper to the film 30' and etching according to a conventional process. The copper lands 33 in the pad contact apertures 34 are then bridged across the I/O pad apertures as shown. The lands 33 are depressed to the underside of the film 30' as shown. One method for so preforming comprises simple steps of placing a relatively flexible rubber sheet atop the upper film 30" and compressing this sandwich between rigid plates. The flow of rubber will form the loops in the aperture 51. The lands are formed about the connecting pin apertures 41 to form conductive viaducts as shown. The lands 33 and the I/O pads 36 are joined electrically by solder fillets 38. I The preformed lands attract the solder due to surface tension and keep it from solder-bridging to other pads. These joints have some flexibility also. Solder fillets 48 electrically join the lands 33 to the pins 46.

Figure 5:
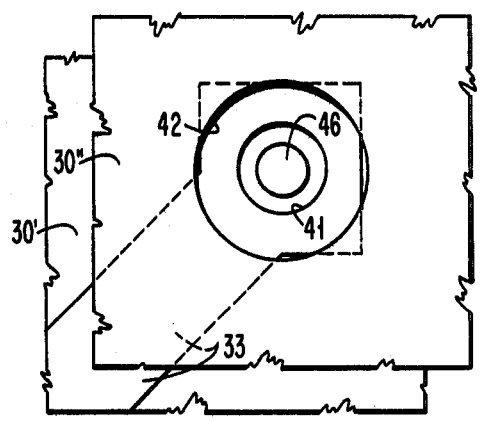
FIG. 5 is a diagram showing the configuration of parts at the connector pin end of a conductor of the electronic device assembly incorporating the interconnecting member according go the invention.
Figure 4:
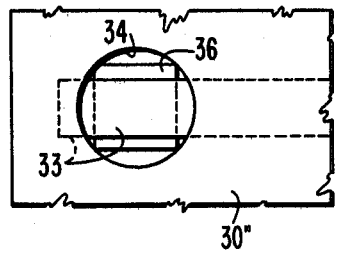
FIG. 4 is a diagram showing the relative dimensions of parts of an electronic device assembly incorporating an interconnecting member according to the invention.

FIGS. 4 and 5 are plan views about the apertures 31 and 41-42, respectively. From these views, it is readily seen that despite the high density of I/O pads 36 and connecting pins 46, there is sufficient room to accommodate some misalignment that inadvertently creeps into any manufacturing process.

Figure 2:
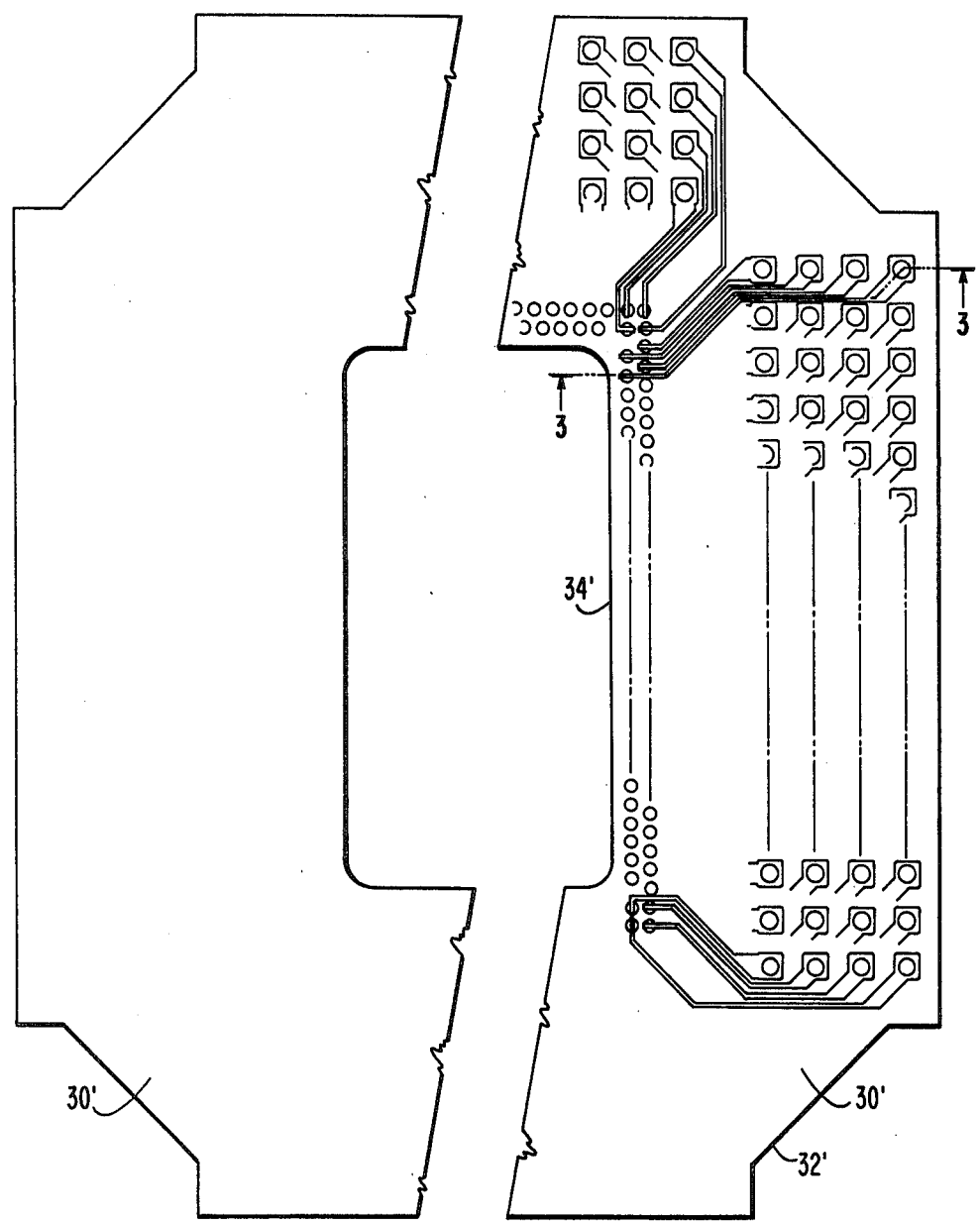
FIG. 2 is a plan view of an electronic circuit packaging interconnecting member according to the invention.

This interconnective design effectively places substrate I/O lines close on centers by using two staggered rows of I/O pads on each side of the substrate as shown in FIG. 2. The spacing between I/O pads on the substrate 12 and on the member 30 is defined by the photolithographic techniques used. Spacing tolerance is controlled by the accuracy of the photolithographic technique, not by the physical dimensions of the ceramic substrate or those of the connector blocks.

Figure 3:
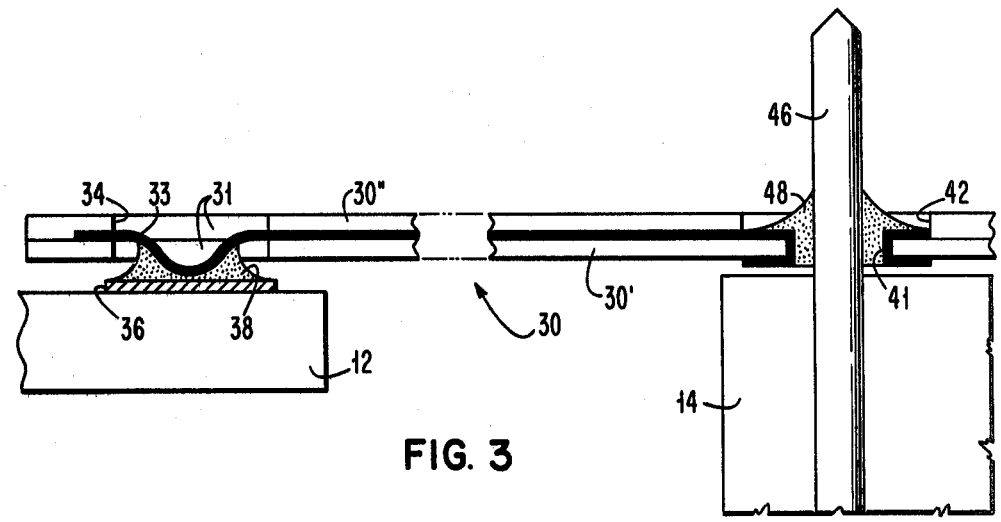
FIG. 3 is a cross-section view of the interconnecting member taken along the line 3—3 in FIG. 2 and in relationship to a substrate terminal pad and a corresponding connector block pin.

The form factor of the copper land combined with the wetting action and surface tension of the solder will result in the formation of a solder joint as shown in FIG. 3. This joint form factor provides a more compliant bond for each of the I/O pads.

The first design feature is that of an alignment aid. This is illustrated in FIGS. 4 and 5. By centering the copper land and contact aperture over the solder pad for contacts on opposite corners of the substrate, all contacts will be closely centered when joined. The second feature of the design is its deterrent to solder bridging between contacts and/or lines. The form factor of the contact will cause the solder to concentrate about the copper land during the gang soldering step of joining the interconnecting member 30 to the substrate.

The end of the copper land 33 bridging a contact aperture is extended sufficiently beyond the opening 31 to provide a secure anchoring of the land to the polyimide film. This serves to keep the copper lands in close registration with contact design centers. Space is provided between the inner edges of the member 30 and the contact apertures and similarly between the edges of the substrate to allow a conductor to go around one or more contacts. This provides an effective cross-over capability which enhances wirability.

In an exemplary embodiment of interconnecting members according to the invention, the substrate 12 was arranged with the staggered rows of I/O pads 36 around the periphery thereof. In one embodiment, a 36 mm substrate was made with 63 I/O pads on each side. This effectively spaced the pads on 20 mil centers. The diameter of the contact in the polyimide film 30' was 28 mils. The width of the thin copper land bridging is 14 mils. The width of the solder pad on the ceramic substrate was 20 mils.

This design concept provides 252 I/O's on a 36 mm substrate without serious impact on substrate area available for chips and wiring. Chip area available is about 3.05 cm (1.2 inches) square or 68 percent of the surface area of a 36 mm substrate. Use of this feature is illustrated schematically in FIG. 1. Five VLSI chips, about 6 mm square, can be placed comfortably within the mounting surface area available on a multilevel ceramic substrate.

While the invention has been described in terms of an express embodiment, and alternatives have been suggested, it is clearly to be understood that those skilled in the art will effect further changes without departing from the spirit and scope of the invention as defined in the appended claims.

The invention claimed is:

1. A thin, flat compliant member for selectively interconnecting a first plurality of electrical pretinned connecting pads arranged in a first predetermined pattern on the surface of a ceramic substrate to a second plurality of pretinned electrical connecting pins arranged in a second predetermined pattern adjacent said ceramic substrate, said member comprising:
   (a) a first flat compliant film having a third plurality of apertures corresponding substantially to said first plurality and arranged in said first predetermined pattern to permit registering each of said apertures with one of said electrical connecting pads, and a fourth plurality of other apertures corresponding to said second plurality and arranged in said second predetermined pattern to permit registering each of said other apertures concentric with one of said electrical connecting pins;

(b) a plurality of conductors affixed to said film, each of which extends from one of said apertures of said third plurality to one of said other apertures of said fourth plurality, each conductor having a first end portion including an opening therein concentric with a different said other aperture of said fourth plurality and a second end portion which extends over a different one of said apertures of said third plurality, each of said apertures of said first plurality having a dimension which corresponds substantially to the widest dimension of one of said pretinned connecting pads, the portion of each of said conductors that extends over said aperture having a width which is less than the width of said pad and substantially half the diameter of said aperture, said portion of said conductor which extends over said aperture being formed to present a bottom surface of said conductor below the bottom surface of said member to permit precise intimate contact with a predetermined one of said pretinned pads when said member is positioned accurately on said substrate to control the flow of solder from each pretinned connecting pad to only its associated conductor during gang soldering of said member to said substrate; and (c) a compliant protective layer disposed over said conductors on said first flat compliant film to allow at least two spaced-apart apertures which are located at different corners of said first predetermined pattern to be visually aligned with associated pads so that the respective edges of each said aligned apertures are equidistant from the sides of said associated pads whereby each of said apertures of said first and second predetermined patterns are accurately aligned respectively with their associated connecting pads and connecting pins.

2. The member recited in claim 1 in which said apertures of said first and second predetermined patterns are round and said connecting pads are square with said diameter of said apertures associated with a connecting pad corresponding to the diagonal of said square to permit said aligned apertures to be simply and precisely visually centered relative to its associated square pad.

3. The member recited in claim 2 in which said member is substantially square and provided with a square window, said first predetermined pattern comprises one pair of rows disposed adjacent each of the four sides of said window and said second predetermined pattern comprises four separate rectangular blocks, each of which is disposed adjacent an outer edge of said member and includes a plurality of said other apertures aligned in a matrix configuration of rows and columns.

4. The member recited in claim 3 in which said apertures in said pairs of rows of said first predetermined pattern are offset relative to each other in a direction parallel to said rows to permit routing of said conductors to said apertures.

* * * * *